United States Patent
Das (10) Patent No.: US 11,646,750 B2
(45) Date of Patent: May 9, 2023

(54) SUCCESSIVE APPROXIMATION ANALOG-TO-DIGITAL CONVERTER

(71) Applicant: TEXAS INSTRUMENTS INCORPORATED, Dallas, TX (US)

(72) Inventor: Abhijit Kumar Das, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 17/490,138

(22) Filed: Sep. 30, 2021

(65) Prior Publication Data
US 2023/0099011 A1 Mar. 30, 2023

(51) Int. Cl.
*H03M 1/12* (2006.01)
*H03M 1/46* (2006.01)
*H03M 1/36* (2006.01)

(52) U.S. Cl.
CPC ......... *H03M 1/462* (2013.01); *H03M 1/1245* (2013.01); *H03M 1/362* (2013.01); *H03M 1/466* (2013.01)

(58) Field of Classification Search
CPC .... H03M 1/462; H03M 1/1245; H03M 1/362; H03M 1/466
USPC ................................ 341/144, 155, 163, 172
See application file for complete search history.

(56) References Cited

U.S. PATENT DOCUMENTS

| 7,796,077 | B2 | 9/2010 | Mitikiri |
| 9,853,655 | B1 | 12/2017 | Pernull et al. |
| 10,761,135 | B2 | 9/2020 | Schmalzl |
| 2021/0264858 | A1* | 8/2021 | Wang ................... G09G 3/3258 |

* cited by examiner

*Primary Examiner* — Peguy Jean Pierre
(74) *Attorney, Agent, or Firm* — Michael T. Gabrik; Frank D. Cimino (57) ABSTRACT

An analog-to-digital converter (ADC) is provided. In some examples, the ADC includes a first reference voltage supply input, a second reference voltage supply input, a comparator comprising an input node, and a first reference switch coupled between the second reference voltage supply input and the input node of the comparator. The ADC also includes a set of capacitors, where each capacitor of the set of capacitors comprises a first terminal. In addition, the ADC includes a second reference switch coupled between the first reference voltage supply input and the first terminal of each capacitor of the set of capacitors. The ADC further includes a third switch coupled between the input node of the comparator and the first terminal of each capacitor of the set of capacitors.

20 Claims, 6 Drawing Sheets

SUCCESSIVE APPROXIMATION ANALOG-TO-DIGITAL CONVERTER

BACKGROUND

A successive approximation analog-to-digital converter (SAR ADC) converts an analog input signal to a digital number using a digital-to-analog converter (DAC) coupled to an input of a comparator. The DAC includes a bank of capacitors, where a first terminal of each capacitor is coupled to the comparator input. The second terminal of each capacitor may be coupled, via a network of switches, to a high-side reference voltage supply, a low-side reference voltage supply, or the analog input signal.

SUMMARY

In some examples, an analog-to-digital converter (ADC) includes a first reference voltage supply input, a second reference voltage supply input, a comparator comprising an input node, and a first reference switch coupled between the second reference voltage supply input and the input node of the comparator. The ADC also includes a set of capacitors, where each capacitor of the set of capacitors comprises a first terminal. In addition, the ADC includes a second reference switch coupled between the first reference voltage supply input and the first terminal of each capacitor of the set of capacitors. The ADC further includes a third switch coupled between the input node of the comparator and the first terminal of each capacitor of the set of capacitors.

In further examples, a method includes activating, during a sampling phase, a first reference switch coupled between a second reference voltage supply and an input node of a comparator. The method also includes activating, during the sampling phase, a second reference switch coupled between a first reference voltage supply and a first terminal of each capacitor of a set of capacitors. In addition, the method includes deactivating, during the sampling phase, a third switch coupled between the input node of the comparator and the first terminal of each capacitor of the set of capacitors. The method further includes deactivating the first reference switch to initiate a noise-elimination phase after the sampling phase. The method includes activating the third switch after deactivating the first reference switch and during the noise-elimination phase.

In yet further examples, a circuit includes a first reference voltage supply, a second reference voltage supply, and a third reference voltage supply, where a voltage magnitude of the third reference voltage supply is between a voltage magnitude of the first reference voltage supply and a voltage magnitude of a second reference voltage supply. The circuit also includes a comparator comprising an input node, a first reference switch coupled between the third reference voltage supply and the input node of the comparator, and a set of capacitors. Each capacitor of the set of capacitors comprises a first terminal and a second terminal, and the set of capacitors comprises a first capacitor, where a capacitance of the first capacitor is one-half of a total capacitance of the set of capacitors. In addition, the circuit includes an array of switches, where each switch of the array of switches is coupled to a second terminal of a respective capacitor of the set of capacitors. The circuit further includes an analog input node coupled to the second terminal of the first capacitor, a second reference switch coupled between the first reference voltage supply and the first terminal of each capacitor of the set of capacitors, and a third switch coupled between the input node of the comparator and the first terminal of each capacitor of the set of capacitors.

BRIEF DESCRIPTION OF THE DRAWINGS

Features of the present invention may be understood from the following detailed description and the accompanying drawings. In that regard.

DETAILED DESCRIPTION

Specific examples are described below in detail with reference to the accompanying figures. It is understood that these examples are not intended to be limiting, and unless otherwise noted, no feature is required for any particular example. Moreover, the formation of a first feature over or on a second feature in the description that follows may include examples in which the first and second features are formed in direct contact and examples in which additional features are formed between the first and second features, such that the first and second features are not in direct contact.

Like all other electronic components, analog-to-digital converters (ADCs) are under constant pressure to occupy less chip space. To achieve higher density, a smaller process node can used to the manufacture an ADC, which means a thinner dielectric layer for the capacitors and/or a thinner gate dielectric layer for the switches. A thinner dielectric layer for a capacitor can reduce the voltage rating for the capacitor. Along with smaller process nodes, electronic devices are being designed with lower reference voltages to accommodate the relatively low voltage ratings of the components within those devices. Moreover, a lower reference voltage for a device generally results in lower power consumption by the device.

Many ADCs are built to allow a specific voltage range for the analog input signal, where the range may span three volts, 3.3 volts, or five volts, as just a few examples. Purchasers of the ADCs may integrate the ADCs into larger devices or systems that are designed for the specific, legacy voltage range. Thus, despite smaller process nodes and lower voltage ratings for capacitors, a new ADC may be designed to tolerate a legacy voltage range. A relatively large voltage range for the analog input signal, as compared to the reference voltage(s), can present issues for components with low voltage ratings within the ADC.

In some examples, such as for charge-redistribution successive-approximation (SAR) ADCs, the analog input voltage may be applied to a terminal of one or more of the capacitors. If a middle reference voltage is applied to the opposing terminal of the capacitor, the voltage drop across the capacitor may exceed or be close to the voltage rating, depending on the voltage magnitude of the analog input signal.

Usually to improve noise and other performance, the reference voltage of the ADC is set as the maximum safe operating voltage limit of the transistors (e.g., N-type and P-type metal-oxide-semiconductor transistors) that are available for that process. As the process node shrinks, these reference voltages tend to go down and limit the maximum voltage for the reference positive and negative terminals as well as the maximum voltage allowed across high density metal capacitors. For example, in an ADC with a 3.3-volt range built with a relatively small process node that supports only 1.8-volt transistors, the middle reference voltage may be 0.9 volts, which is halfway between zero (negative reference) and 1.8 volts (positive reference). When an analog input signal with a voltage magnitude of 3.3 volts is applied to a capacitor, the voltage across the capacitor will be 2.4 volts, which may be above the voltage rating of the high density capacitor in that process node. However, to increase the voltage rating of the capacitor may require a bulkier capacitor that will increase the silicon or die area of the ADC and may sometimes limit the performance achievable by the ADC.

This disclosure describes techniques for potentially reducing the maximum voltage across a capacitor having a terminal coupled to an analog input signal. Instead of coupling a middle reference voltage supply to the other terminal of the capacitor, a circuit may include a high-side reference voltage supply that can be coupled, via a reference switch, to the other terminal of the capacitor. A control circuit may be configured to drive the high-side reference voltage supply to the other terminal of the capacitor during, for example, a sampling and comparator auto-zero phase.

The voltage magnitude of the high-side reference voltage supply may be closer to the maximum voltage magnitude of the analog input signal than the middle reference voltage supply is to the maximum voltage magnitude of the analog input signal. For example, where the analog input signal has a 3.3-volt range, a high-side reference voltage supply of 1.8 volts is closer to the maximum voltage magnitude of the analog input signal (e.g., 3.3 volts, or 3.63 volts with a ten-percent tolerance) than a middle reference voltage supply of 0.9 volts is to the maximum voltage magnitude of the analog input signal. As a result, the likelihood of failure for the capacitor may be reduced by coupling the high-side reference voltage supply to the second terminal of the capacitor.

Moreover, the techniques of this disclosure may allow for the use of a higher maximum voltage magnitude for the analog input signal, as compared to another circuit where the control circuit drives a middle reference voltage to the top terminals of the capacitors. For example, using the example voltage levels described above, a maximum voltage range for the analog input signal may be 3.3 volts with a ten-percent tolerance (e.g., a tolerance maximum of 3.63 volts), even where the difference between the high-side and low-side reference voltage levels is 1.8 volts or two volts. Of course, these advantages are merely examples, and no advantage is required for any particular embodiment.

Figure 1:
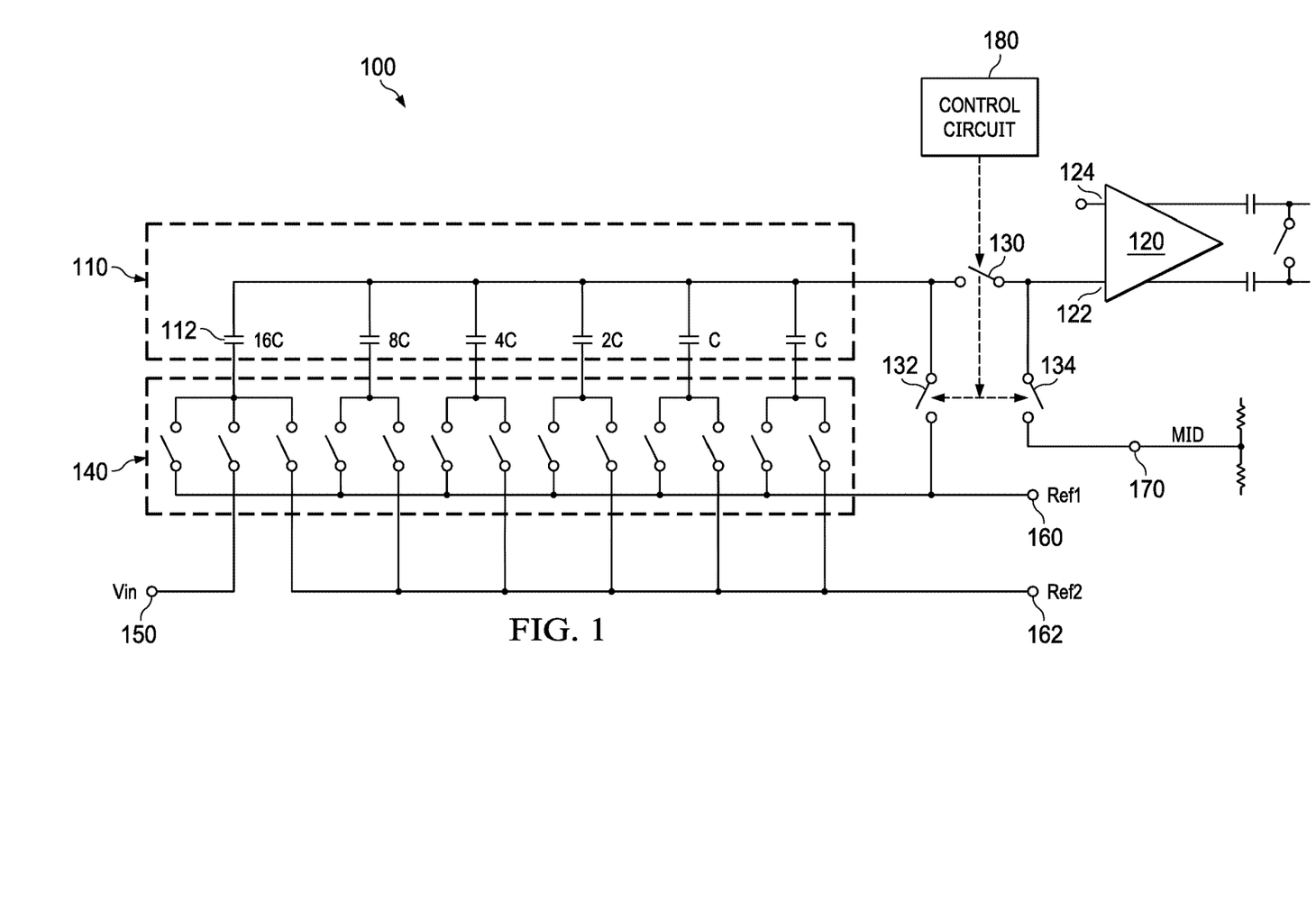
FIG. 1 is a circuit diagram of an analog-to-digital converter (ADC) including a set of capacitors coupled to an input node of a comparator via a switch according to some aspects of the present disclosure.

Examples of these techniques are described with reference to the figures below. In that regard, FIG. 1 is a circuit diagram of an ADC 100 including a set of capacitors 110 coupled to input node 122 of comparator 120 via switch 130 according to some aspects of the present disclosure. The circuit shown in FIG. 1 may be part of an ADC, such as a charge-redistribution SAR ADC or another SAR ADC. Alternatively, the circuit may be part of another component or system such as a digital-to-analog converter (e.g., outside of an ADC), temperature sensing circuitry, electronic circuitry, automotive applications, image sensing circuitry, video sensing circuitry, control circuitry, and/or any other application that uses a capacitor array.

In the example shown in FIG. 1, the circuit also includes reference switches 132 and 134, set of switches 140, analog input signal node 150, reference voltage supply inputs 160 and 162, middle reference voltage supply input 170, and control circuit 180. Some or all of the components shown in FIG. 1 may be integrated onto a single semiconductor die. In examples in which some or all of the components shown in FIG. 1 are integrated onto a semiconductor die, the die may include an input node (not shown in FIG. 1) coupled to the bottom terminal of capacitor 112 and configured to receive an analog input signal from node 150 from an external source. Alternatively, the components shown in FIG. 1 may be arranged in multiple semiconductor dies, as discrete components on a single circuit board or on multiple circuit boards, or in any other arrangement.

Each of switches 130, 132, 134, and 140 can be implemented as one or more transistors, other voltage-controlled elements, and/or diodes. Each of switches 130, 132, 134, and 140 can be implemented as a MOS transistor, a bipolar junction transistor, an insulated-gate bipolar transistor, and/or any other type of transistor. Any of switches 130, 132, and 134 can be implemented as one or more voltage-controlled elements coupled in series and/or parallel. Each of switches 130, 132, 134, and 140 may include three or more terminals including a control terminal (e.g., a gate terminal or base terminal), a first load terminal (e.g., a source terminal or emitter terminal), and a second load terminal (e.g., a drain terminal or collector terminal).

Each of capacitors 110 includes a first terminal depicted as a top plate and a second terminal depicted as a bottom plate. The first terminal of each of capacitors 110 is coupled via switch 130 to input node 122 of comparator 120. The second terminal of each of capacitors 110 is coupled via one or more switches 140 to reference voltage supply inputs 160 and 162 and/or analog input signal node 150. For example, capacitor 112 is coupled to analog input signal node 150 via one of switches 140. Additionally or alternatively, a different capacitor or a different number of capacitors 110 (e.g., none, all, or more than one) may be coupled to analog input signal node 150 via one or more of switches 140. Switches 140 may be controlled by another controller separate from control circuit 180, or switches 140 may be controlled by the same control circuit 180 that controls switches 130, 132, and 134.

Each of capacitors 110 has a capacitance value that is a portion of the total, combined capacitance of capacitors 110. For example, the capacitance of capacitor 112 may represent approximately one-half of the total capacitance of capacitors 110. A second capacitor of capacitors 110 may have a capacitance that represents approximately one-quarter of the total capacitance of capacitors 110, and a third capacitor of capacitors 110 may have a capacitance that represents approximately one-eighth of the total capacitance of capacitors 110. In examples in which capacitors are connected in parallel, the total, combined capacitance of capacitors 110 may be equal to the sum of the capacitances of each of capacitors 110.

Comparator 120 may include an analog comparator that functions like a differential amplifier. Input node 124 of comparator 120 may be coupled to one of reference voltage supply input 160 and 162 or to analog input signal node 150. The power supply nodes of comparator 120 (not shown in FIG. 1) may be coupled to reference voltage supply inputs 160 and 162 or may be of the same magnitude as positive reference voltage value 160. It is desirable to have minimum measurement error from comparator 120 and hence it may be desirable to keep the voltage level at input node 122 at least a few hundred millivolts away from the voltage magnitudes of the supplies powering comparator 120. During the conversion phase of the operation, it is desirable to deactivate switches 132 and 134 but keep switch 130 activated. It may be desirable for input node 122 of comparator 120 (which may be an amplifier in some examples) to have a voltage level in the similar operating region as during the conversion phase while in the comparator auto-zero phase. This can be done simultaneously while sampling the voltage level at analog input voltage node 150 to reduce the total time required by the circuit to perform the operation.

Reference voltage supply inputs 160 and 162 can be coupled to supply circuits that provide the high-side and low-side power supplies, respectively, for the circuit shown in FIG. 1. In some examples, the lower reference voltage supply coupled to input 162 may have a voltage magnitude defined as zero volts (e.g., reference ground), and the upper reference voltage supply coupled to input 160 may have a relative voltage magnitude of, for example, one volt, 1.2 volts, 1.8 volts, two volts, 2.5 volts, three volts, 3.3 volts, or four volts. The middle reference voltage supply coupled to input 170 may have a voltage magnitude that is between the voltage magnitudes of the reference voltage supplies coupled to inputs 160 and 162 (e.g., approximately halfway between these reference voltages). The upper, lower, and middle reference voltage supplies may be external to ADC 100, or the upper, lower, and middle reference voltage supplies may be part of ADC 100.

The voltage rating of capacitors 110 are based on the process node. Capacitors 110 are manufactured at a process node, such as 65 nanometers, 45 nanometers, 28 nanometers, or 16 nanometers. The value of the process node may indicate the thickness of the dielectric layer of each of capacitors 110. For smaller processes, the voltage rating of a capacitor is typically smaller, as compared to larger processes. High voltage tolerant capacitors are often very bulky and, in some cases, not available in advanced process nodes, such as some 16-nanometer process nodes.

In accordance with the techniques of this disclosure, switch 130 is coupled between input node 122 and the first terminal of each of capacitors 110. By activating or closing switch 130, control circuit 180 can couple input node 122 to the first terminal of each of capacitors 110. Reference switch 132 is coupled between the first terminal of each of capacitors 110 and upper reference voltage supply input 160. By activating reference switch 132, control circuit 180 can couple upper reference voltage supply input 160 to the first terminal of each of capacitors 110. By activating both of switches 130 and 132, control circuit 180 can couple upper reference voltage supply input 160 to input node 122 and to the first terminal of each of capacitors 110. Reference switch 134 is coupled between input node 122 and middle reference voltage supply input 170. By activating reference switch 134, control circuit 180 can couple input node 122 to middle reference voltage supply input 170. As discussed below, control circuit 180 may be configured to activate and deactivate switches 130, 132, and 134 in a predefined sequence of phases in order to couple and decouple reference voltage supply inputs 160 and 170 from other nodes in the circuit.

In some examples, the configuration of switches 130, 132, and 134 may allow for operations that include a sampling and comparator auto-zero phase, a noise-elimination phase, and a conversion phase. In the sampling and comparator auto-zero phase, control circuit 180 may be configured to activate reference switch 132 to couple the top terminal of each of capacitors 110 to upper reference voltage supply input 160 in order to bias the top terminal. During the sampling and comparator auto-zero phase, control circuit 180 may be configured to also activate reference switch 134 and deactivate autozero-switch 130 to couple input node 122 to middle reference voltage supply input 170. Middle reference voltage supply input 170 can be a middle reference voltage or any other suitable voltage that allows best performance from comparator 120 during offset-cancellation, auto-zeroing, or some other use of comparator 120 during this time.

During a transition to the noise-elimination phase, control circuit 180 may be configured to deactivate reference switch 134 and subsequently activate auto-zero switch 130. Thus, in the noise-elimination phase, the top terminal of each of capacitors 110 and input node 122 are coupled to upper reference voltage supply input 160. Any noise injected or caused by the change of switch 130 or 134 is eliminated or removed as the top terminals of capacitors 110 are strongly connected to reference voltage supply input 160 via reference switch 132. During a transition to the conversion phase, control circuit 180 may be configured to deactivate reference switch 132 to decouple reference voltage supply inputs 160 and 170 from the top terminal of each of capacitors 110.

TABLE 1

Control of switches 130, 132, and 134

| Switch | Sampling and Comparator Auto-zero Phase | Transition to Noise-Elimination Phase | Noise-Elimination Phase | Transition to Conversion Phase 3 | Conversion Phase |
|---|---|---|---|---|---|
| 130 | Off | Activate | On | Maintain | On |
| 132 | On | Maintain | On | Deactivate | Off |
| 134 | On | Deactivate | Off | Maintain | Off |

Figure 3:
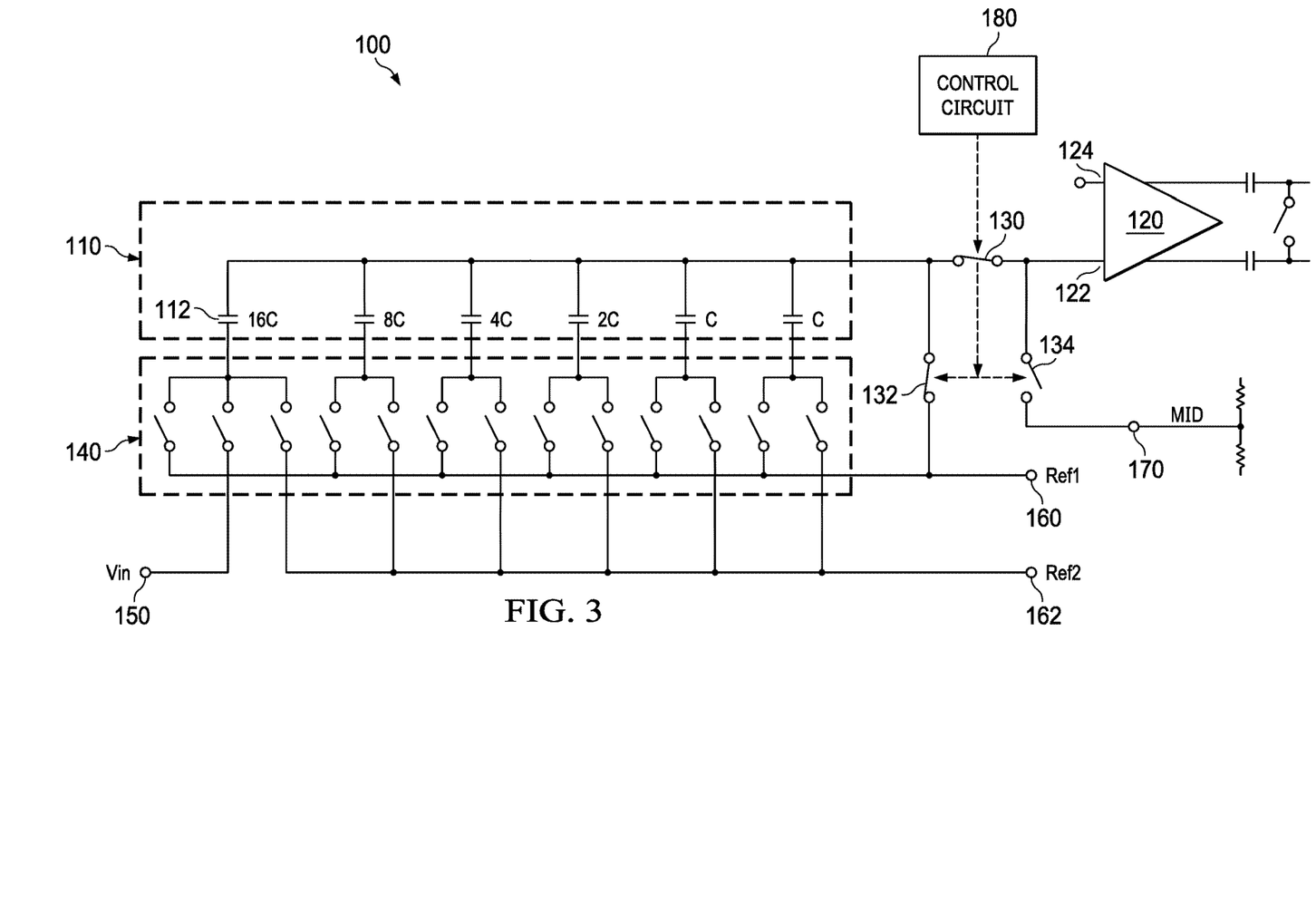
FIG. 3 is a circuit diagram of an ADC during a noise-elimination phase according to some aspects of the present disclosure.
Figure 4:
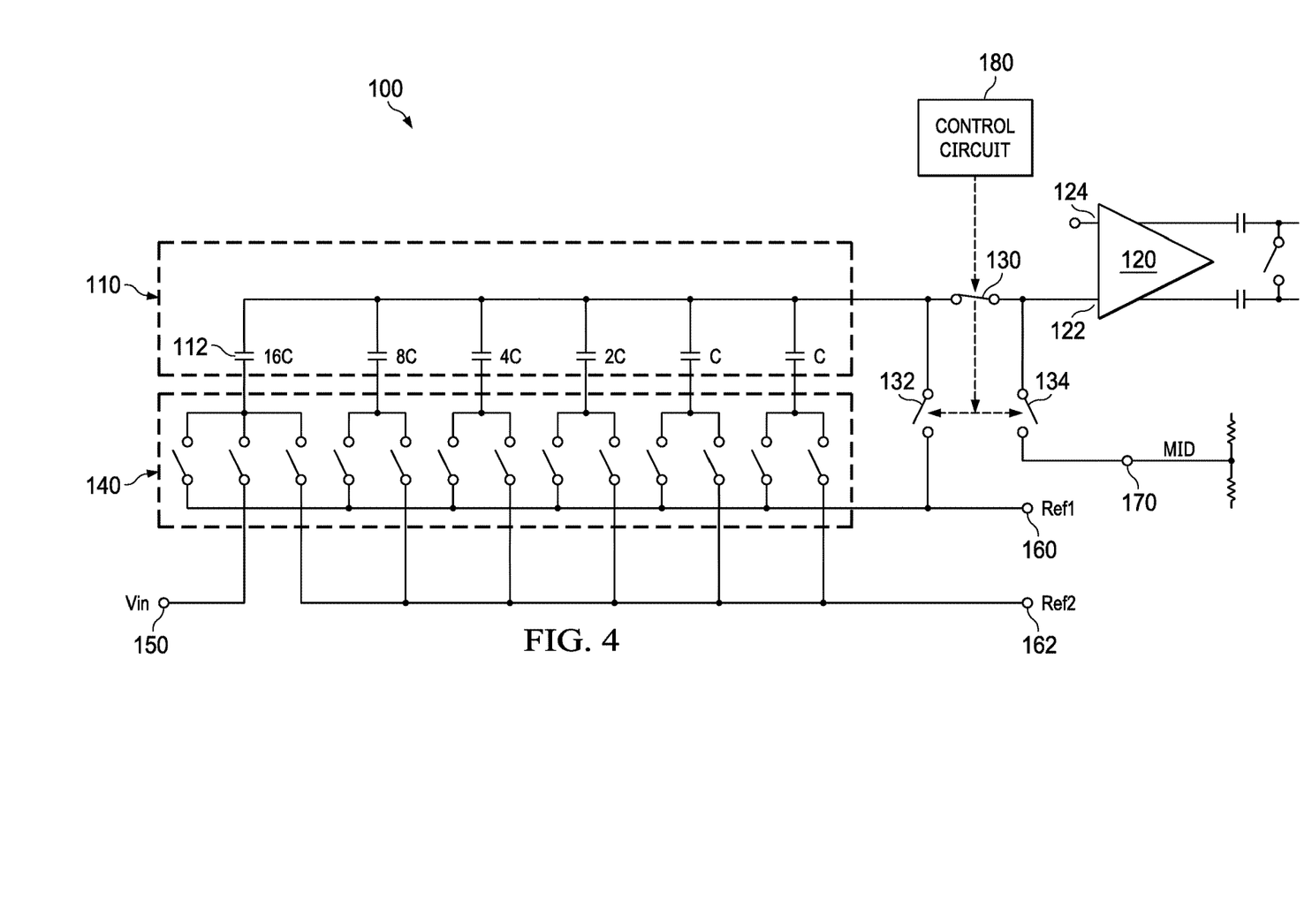
FIG. 4 is a circuit diagram of an ADC during a conversion phase according to some aspects of the present disclosure.

Table 1 shows the control of each of switches 130, 132, and 134 during the three phases, including the transitions between phases. The activation states of the switches 130, 132, and 134 during the three phases are depicted in FIGS. 2-4.

Figure 2:
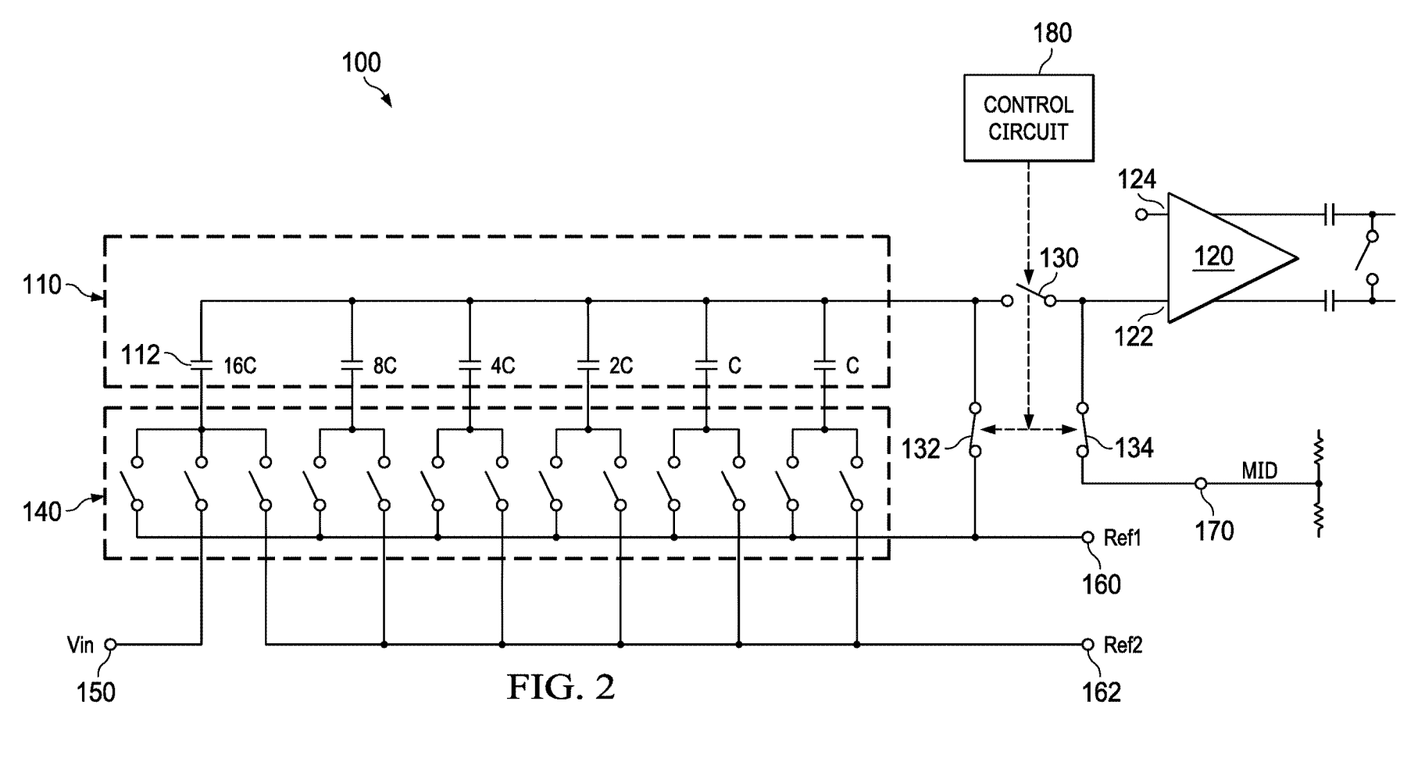
FIG. 2 is a circuit diagram of an ADC during a sampling and comparator auto-zero phase according to some aspects of the present disclosure.

FIG. 2 is a circuit diagram of ADC 100 during a sampling and comparator auto-zero phase according to some aspects of the present disclosure. During the sampling and comparator auto-zero phase, control circuit 180 or another circuit not shown in FIG. 2 may be configured to control switches 140 to couple the bottom terminal of capacitor 112 to analog input voltage node 150. Control circuit 180 or the other circuit may be configured to control switches 140 to couple the bottom terminal of the remaining capacitors to positive reference voltage 160 or negative reference voltage 162 as needed by the design.

During the sampling and comparator auto-zero phase, control circuit 180 activates reference switch 132 to couple upper reference voltage supply input 160 to the top terminal of capacitors 110. Control circuit 180 deactivates switch 130 to isolate the top terminal of capacitors 110 from middle reference voltage supply input 170.

Coupling upper reference voltage supply input 160, rather than middle reference voltage supply input 170, to the top terminal of capacitor 112 may result in a lower voltage drop across capacitor 110 when the analog input signal has a relatively high voltage magnitude. In an example where the upper reference voltage supply coupled to input 160 is 1.8 volts and the analog input signal is between zero volts and 3.6 volts, the maximum voltage across capacitor would be plus or minus 1.8 volts. This reduced voltage drop may be especially beneficial for smaller process nodes, such as 45 nanometers, 40 nanometers, 65 nanometers, 28 nanometers, or a similar process node. In some examples, the maximum voltage rating for a 45-nanometer capacitor may be 2.8 volts, and the maximum voltage rating for a 16-nanometer capacitor may be even lower.

During the sampling and comparator auto-zero phase, comparator 120 may be configured to perform operations such as auto-zeroing, offset correction, and/or offset cancelation. It may be desirable for comparator 120 to perform these operations in the sampling and comparator auto-zero phase while the voltage level at input node 122 is substantially equal to the voltage level that will likely occur at input node 122 during the conversion phase. The likely voltage level at input node 122 during the conversion phase is halfway between the voltage magnitudes of the reference voltage supplies coupled to inputs 160 and 162. Thus, control circuit 180 can activate reference switch 134 to couple input node 122 to middle reference voltage supply input 170 to assist with offset correction operations performed by comparator 120.

During the sampling and comparator auto-zero phase, ADC 100 may be configured to measure an offset voltage of comparator 120. Comparator 120 may have an offset voltage caused by the temperature of ADC 100, bias and/or leakage currents, the manufacturing process of ADC 100, and/or changes in circuitry since fabrication. To improve the performance of ADC 100, ADC 100 may be configured to store the offset voltage, or an indication thereof, in a memory and/or on a capacitor outside of capacitors 110. ADC 100 may be configured to use the offset voltage for correction during the conversion phase to determine a digital number that represents the correct magnitude of the analog input signal.

In the example shown in FIG. 2, the middle reference voltage supply coupled to input 170 is driving input node 122 of comparator 120. Because the middle reference voltage supply coupled to input 170 is not driving the top terminals of capacitors 110, the middle reference voltage supply coupled to input 170 may be implemented without using a sizeable buffer circuit. In alternative examples where the middle reference voltage supply coupled to input 170 does drive the top terminals of the capacitors 110, the top terminals of capacitors 110 may act as a large capacitive load such that a resistive divider with a high total resistance may not be capable of driving the top terminals. In the example shown in FIGS. 1-4, the middle reference voltage supply coupled to input 170 may include a resistive divider or resistive ladder or a very low-cost (e.g., lower power and area) buffer circuit for generating the middle reference voltage because the middle reference voltage supply coupled to input 170 is not driving the top terminals of capacitors 110.

FIG. 3 is a circuit diagram of ADC 100 during noise-elimination phase according to some aspects of the present disclosure. During this phase, control circuit 180 may be configured to activate switches 130 and 132 and deactivate reference switch 134. In the example shown in FIG. 3, control circuit 180 activates reference switch 132 during the noise-elimination phase to couple upper reference voltage supply input 160 to input node 122 and to the top terminal of capacitors 110. In other words, the top terminals of capacitors 110 and input node 122 are driven by the upper reference voltage supply coupled to input 160 during the noise-elimination phase.

Whenever the control circuit 180 activates switch 130 or deactivates reference switch 134, switch 130 or 134 may inject noise on the top plate of capacitors 110. This can be very detrimental to the performance of ADC as this directly introduces noise to the most sensitive part of the design. During the noise-elimination phase, the reference voltage supply coupled to input 160 is strongly coupled to the top plate of capacitors 110 via reference switch 132. Thus, this injected noise is absorbed by the reference voltage supply coupled to input 160 and does not get accumulated or stored on capacitors 110.

FIG. 4 is a circuit diagram of ADC 100 during a conversion phase according to some aspects of the present disclosure. During the conversion phase, control circuit 180 may be configured to maintain switch 130 in an activated state and deactivate reference switches 132 and 134. There may be zero or almost zero leakage current through reference switches 132 and 134 during the conversion phase, or the leakage current can be compensated or eliminated by using a standard differential technique. Thus, reference switches 132 and 134 may have little or no impact on the operation of ADC 100 during the conversion phase, which is also known as the bit-cycling phase. During the conversion phase, ADC 100 can convert the analog input signal to a digital number.

To convert the analog input signal to a digital number during the conversion phase, ADC 100 may be configured to iterate through a series of conversion steps. For example, in a first step, ADC 100 may control switches 140 to couple the bottom terminal of capacitor 112 to reference voltage supply input 160 while coupling the bottom terminal of the remaining capacitors 110 to reference voltage supply input 170. This operation forms a capacitive divider circuit where input node 122 is connected between reference voltage supply inputs 160 and 170. ADC 100 can use the output of comparator 120 during the first step as the first bit of the digital number. In a second step, depending on the result of the first step, ADC 100 may control switches 140 to couple the bottom terminal of a second capacitor to reference voltage supply input 160 while coupling the bottom terminal of the remaining capacitors 110 to reference voltage supply input 170. Additional example details of SAR ADCs can be found in commonly assigned U.S. Pat. No. 7,796,077, entitled "High Speed High Resolution ADC Using Successive Approximation Technique," issued on Sep. 14, 2010, which is incorporated by reference in its entirety.

Figure 5:
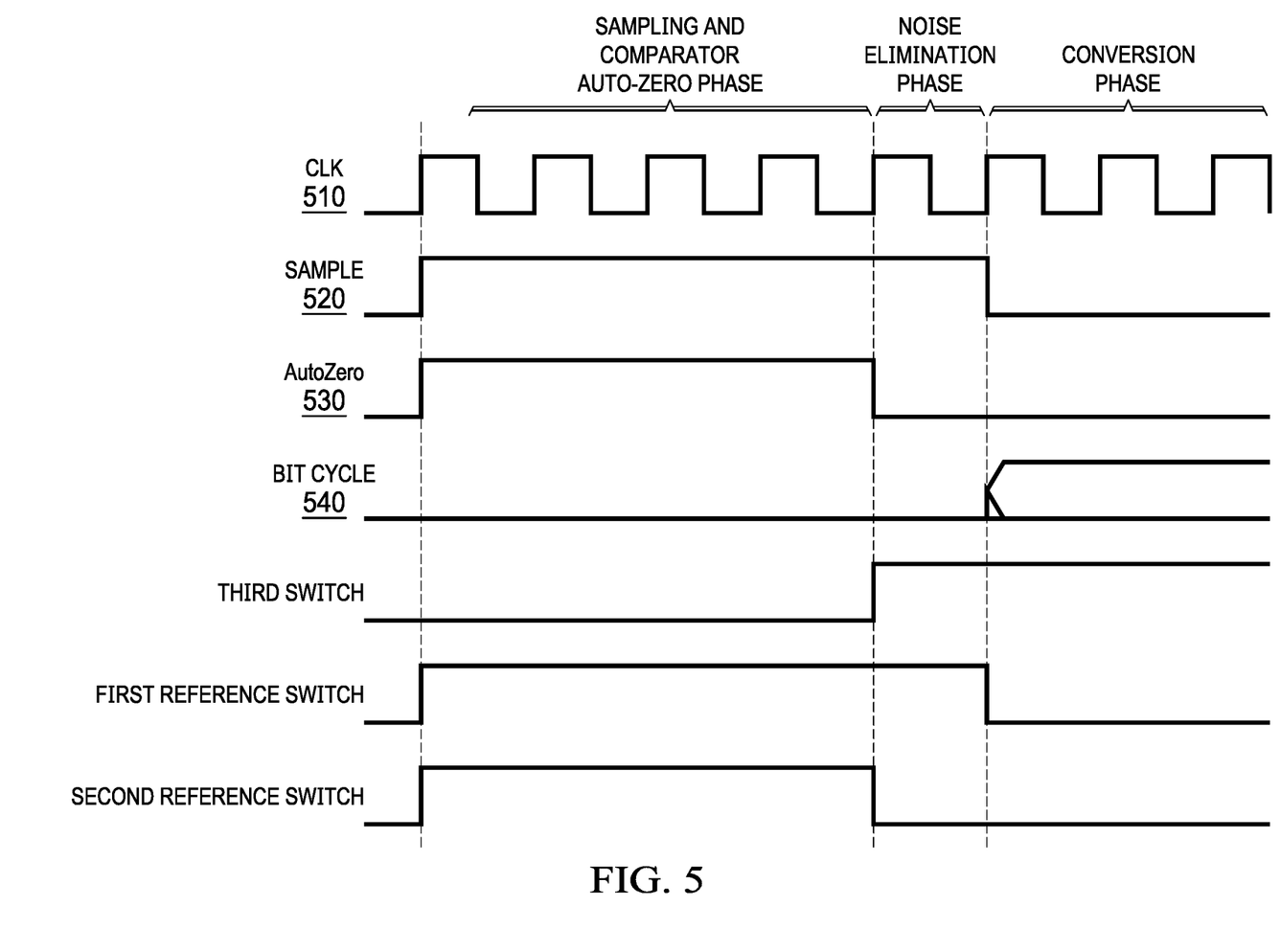
FIG. 5 is a timing diagram illustrating three phases of operation for an ADC according to some aspects of the present disclosure.

FIG. 5 is a timing diagram illustrating three phases of operation for an ADC according to some aspects of the present disclosure. FIG. 5 depicts clock signal 510, sample signal 520, auto-zero signal 530, and bit cycle signal 540. In some examples, a control circuit generates clock signal 510 and receives signals 520 and 530. The control circuit may be configured to control an ADC based on the values of signals 510, 520, and 530. Auto-zero signal 530 may be planned so that auto-zero signal introduces little or no error and does not have tight constraints. Auto-zero signal 530 can be used by an ADC to conduct the auto-zero or offset cancellation period for the ADC. The sampling and comparator auto-zero phase is completely isolated by ensuring switch 130 is deactivated while comparator 120 performs auto-zero operations. Control circuit 180 may be constrained to start the auto-zero operations after or along with the sampling phase. In addition, control circuit 180 may be configured to end the auto-zero operations sufficiently before the end of the sampling phase in order to allocate time for the noise-elimination phase. This is usually very simple to achieve or maintain by control circuit 180. Auto-zero signal 530 may not cause any limitation on input sample bandwidth or any other parameter of the ADC.

The sampling and comparator auto-zero phase is depicted as lasting for five clock cycles, the noise-elimination phase is depicted as lasting for one clock cycle, and the conversion phase is depicted as lasting for at least three clock cycles, but other durations are possible for each phase. In the example shown in FIG. 5, the control circuit may operate in a sampling and comparator auto-zero phase in response to determining that both of sample signal 520 and auto-zero signal 530 have high values. In response to determining that the auto-zero signal 530 has dropped to a low value but sample signal 520 still has a high value, the control circuit may be configured to operate in the noise-elimination phase. Auto-zero signal 530 declines before sample signal 520 declines. The control circuit may be configured to operate in a conversion phase in response to determining that both of signals 520 and 530 have low values.

Figure 6:
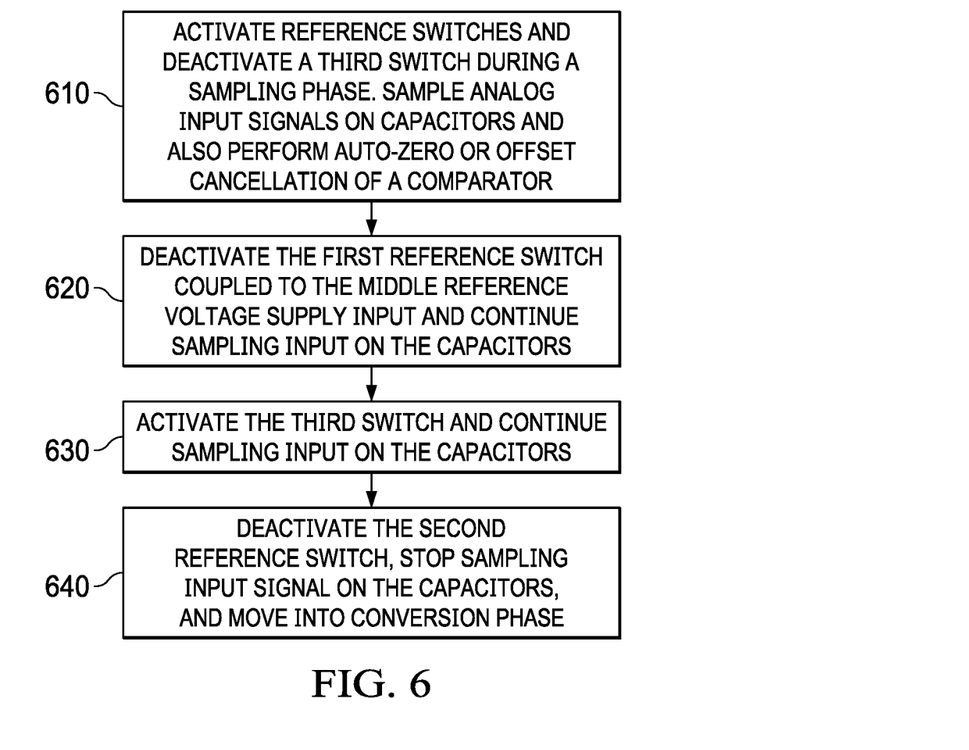
FIG. 6 is a flow diagram of a method for controlling the switches in an ADC according to some aspects of the present disclosure.

FIG. 6 is a flow diagram of a method 600 for controlling the switches in an ADC according to some aspects of the present disclosure. Some processes of the method 600 may be performed in orders other than described, and many processes may be performed concurrently in parallel. Furthermore, processes of the method 600 may be omitted or substituted in some examples of the present disclosure. The method 600 is described with reference to control circuit 180 shown in FIG. 1, although other entities or components may exemplify similar techniques.

Referring to block 610, control circuit 180 activates reference switches 132 and 134 and deactivates switch 130 during a sampling and comparator auto-zero phase. During the sampling and comparator auto-zero phase, input node 122 of comparator 120 is coupled to middle reference voltage supply input 170 so that comparator 120 can perform offset cancelation and auto-zeroing. Capacitors 110 can sample an analog signal from input 150 during the sampling and comparator auto-zero phase.

Referring to block 620, control circuit 180 deactivates reference switch 134 before a noise-elimination phase. Capacitors 110 can continue sampling the analog signal from input 150 during the noise-elimination phase. Referring to block 630, control circuit 180 also activates switch 130 to start the noise-elimination phase. Control circuit 180 deactivates reference switch 134 before activating switch 130 to ensure that upper reference voltage supply input 160 is not coupled to middle reference voltage supply input 170.

Control circuit 180 may be configured to refrain from activating all of switches 130, 132, and 134 at the same time during any phase or any transition. Errors can be injected when any of switches 130, 132, and 134 are transitioning between activated and deactivated states. For example, when control circuit 180 activates switch 130, some noise may be injected into the top terminals of capacitors 110, but upper reference voltage supply input 160 can absorb this noise because reference switch 132 is activated. Upper reference voltage supply input 160 may be able to sink enough charge to absorb any noise, charge injection, permutation, or fluctuations at the top terminals of capacitors 110.

Referring to block 630, control circuit 180 keeps switch 130 and reference switch 132 activated and keeps reference switch 134 deactivated throughout the noise-elimination phase. During the noise-elimination phase, the upper reference voltage supply coupled to input 160 will drive the top terminals of capacitors 110. The upper reference voltage supply coupled to input 160 will also drive input node 122 of comparator 120.

Referring to block 640, control circuit 180 deactivates reference switch 132 to enter into conversion phase. Deactivating reference switch 132 isolates the top terminals of capacitors 110 from upper reference voltage supply input 160. Control circuit 180 keeps switch 130 activated and keeps reference switches 132 and 134 deactivated throughout the conversion phase. Thus, during the conversion phase, the top terminals of capacitors 110 will be isolated from both of reference voltage supply inputs 160 and 170. As switch 132 does not change state (e.g., become activated) after the noise-elimination phase, there is little or no impact of switch 132 during the conversion phase.

Figure 7:
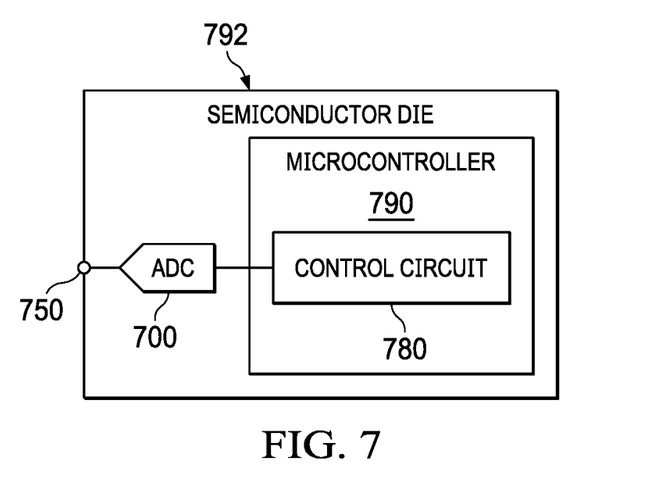
FIG. 7 is a conceptual block diagram of an ADC and a microcontroller including a control circuit.

FIG. 7 is a conceptual block diagram of an ADC 700 and a microcontroller 790 including a control circuit 780. In the example shown in FIG. 7, ADC 700 and microcontroller 790 are integrated onto semiconductor die 792, where control circuit 780 is a part of microcontroller 790. Semiconductor die 792 also includes input node 750 for receiving an analog input signal. It is possible to have microcontroller 790 integrated on the same semiconductor die 792 as ADC 700 as a monolithic design.

Returning to ADC 100 shown in FIG. 1, a low voltage rating on capacitors 110 can limit the maximum voltage level of the analog input signal that can be sampled at the input of ADC 100. For smaller processes, the voltage difference between the high-side reference voltage and the low-side reference voltage may be smaller (e.g., 1.8 volts), as compared to larger processes (e.g., 3.3 volts or five volts). In addition, customers want to use legacy voltage ranges for the analog input signal (e.g., three or five volts) with newer technologies, which can create a relatively large voltage drop across one or more of capacitors 110. Thus, for ADCs manufactured at smaller processes, circuit design becomes more important for minimizing the likelihood of dielectric tunneling, leakage, and/or breakdown in capacitors 110.

As compared to the voltage magnitude of the middle reference voltage supply coupled to input 170, the voltage magnitude of the upper reference voltage supply coupled to input 160 may be closer to the maximum voltage level of the analog input signal. For example, the maximum voltage level of the analog input signal may be greater than three volts, while the voltage magnitude of the upper reference voltage supply coupled to input 160 may be less than three volts and the voltage magnitude of the middle reference voltage supply coupled to input 170 may be even lower than the voltage level at input 160. Thus, coupling upper reference voltage supply input 160 to the top terminal of capacitor 112 may result in a lower maximum voltage drop across capacitor 112, as compared to another circuit where the middle reference voltage supply is coupled to the top terminal of a capacitor.

ADC 100 may be able to support three-volt sampling of the analog input signal at 45-nanometer process nodes and more advanced complementary MOS nodes such as sixteen nanometers. Even higher voltage ranges for the analog input signal may be possible in some examples. ADC 100 may also have high impedance at the node where ADC 100 receives the analog input signal.

The techniques of this disclosure may be especially suited for applications in which the difference between the voltage magnitudes of the reference voltage supplies coupled to inputs 160 and 162 is in a range between zero and five volts, between zero and four volts, between one and four volts, between zero and three volts, between one and three volts, between zero and two volts, or between one and two volts. In addition, the techniques of this disclosure may be especially suited for applications in which the difference between the voltage magnitudes of the reference voltage supplies coupled to inputs 160 and 170 is in a range that is less than the voltage range of the analog input signal, such as between zero and four volts, between five hundred millivolts and four volts, between zero and three volts, between five hundred millivolts and three volts, between zero and two volts, between five hundred millivolts and two volts, or between five hundred millivolts and fifteen hundred millivolts. The techniques of this disclosure may be especially suited for applications in which the voltage range of the analog input signal is greater than or equal to three volts, greater than or equal to four volts, or greater than or equal to five volts. In general, the techniques of this disclosure can be used to support an analog input signal with a voltage level that is higher than the typical dielectric limit of the devices available in that process. As an example, for a five-volt process node, this technique can be used to handle as much as ten-volt analog input signal without any reliability impact while maintaining a high input impedance in a SAR ADC or an equivalent ADC design.

The addition of switches 130, 132, and 134 into ADC 100 can introduce error sources such as noise and/or charge injection. For example, charge injection may occur due to gate-to-source coupling or gate-to-drain coupling from any of switches 130, 132, and 134. The top terminals of capacitors 110 are precision-made for analog design, so even a small amount of error can affect the performance of ADC 100. To reduce any noise on the top terminals of capacitors 110, control circuit 180 can activate reference switch 132 to couple the top terminals of capacitors 110 to upper reference voltage supply input 160. When reference switch 132 is activated, the upper reference voltage supply coupled to input 160 may be able to absorb and eliminate the noise on the top terminals of capacitors 110.

The following numbered aspects demonstrate one or more aspects of the disclosure.

Aspect 1. An ADC includes a first reference voltage supply input, a second reference voltage supply input, a comparator comprising an input node, and a first reference switch coupled between the second reference voltage supply input and the input node of the comparator. The ADC also includes a set of capacitors, where each capacitor of the set of capacitors comprises a first terminal. In addition, the ADC includes a second reference switch coupled between the first reference voltage supply input and the first terminal of each capacitor of the set of capacitors. The ADC further includes a third switch coupled between the input node of the comparator and the first terminal of each capacitor of the set of capacitors.

Aspect 2. The ADC of the preceding aspect or any combination thereof, further comprising a control circuit.

Aspect 3. The ADC of the preceding aspect, where the control circuit is configured to activate the first reference switch during a sampling phase.

Aspect 4. The ADC of aspects 2 or 3 or any combination thereof, where the control circuit is configured to activate the second reference switch during the sampling phase.

Aspect 5. The ADC of aspects 2-4 or any combination thereof, where the control circuit is configured to deactivate the third switch during the sampling phase.

Aspect 6. The ADC of aspects 2-5 or any combination thereof, where the control circuit is configured to cause the comparator to perform auto-zeroing during the sampling phase.

Aspect 7. The ADC of aspects 2-6 or any combination thereof, where the control circuit is configured to cause the comparator to perform offset cancelation or offset correction during the sampling phase.

Aspect 8. The ADC of aspects 2-7 or any combination thereof, where the control circuit is configured to cause the comparator to measure and store an offset voltage of the comparator during the sampling phase.

Aspect 9. The ADC of aspects 2-8 or any combination thereof, where the control circuit is configured to deactivate the first reference switch to initiate a noise-elimination phase after the sampling phase.

Aspect 10. The ADC of aspects 2-9 or any combination thereof, where the control circuit is configured to activate the second reference switch during the noise-elimination phase.

Aspect 11. The ADC of aspects 2-10 or any combination thereof, where the control circuit is configured to activate the third switch after deactivating the first reference switch to initiate the noise-elimination phase.

Aspect 12. The ADC of aspects 2-11 or any combination thereof, where the control circuit is configured to deactivate the first reference switch to initiate a conversion phase after the noise-elimination phase.

Aspect 13. The ADC of aspects 2-12 or any combination thereof, where the control circuit is configured to deactivate the second reference switch during the conversion phase.

Aspect 14. The ADC of aspects 2-13 or any combination thereof, where the control circuit is configured to activate the third switch during the conversion phase.

Aspect 15. The ADC of the preceding aspects or any combination thereof, where the first reference switch includes a first terminal coupled to the second reference voltage supply input.

Aspect 16. The ADC of the preceding aspects or any combination thereof, where the first reference switch includes a second terminal coupled to a third switch and coupled to the input node of the comparator.

Aspect 17. The ADC of the preceding aspects or any combination thereof, where the second reference switch includes a first terminal coupled to the first reference voltage supply input.

Aspect 18. The ADC of the preceding aspects or any combination thereof, where the second reference switch includes a second terminal coupled to the third switch and coupled to the input node of the comparator.

Aspect 19. The ADC of the preceding aspects or any combination thereof, where the third switch includes a first terminal coupled to the first reference switch and coupled to the input node of the comparator.

Aspect 20. The ADC of the preceding aspects or any combination thereof, where the third switch includes a second terminal coupled to the second reference switch and coupled to the first terminal of each capacitor of the set of capacitors.

Aspect 21. The ADC of the preceding aspects or any combination thereof, further including a resistive divider circuit coupled to the second reference voltage supply input.

Aspect 22. The ADC of the preceding aspects or any combination thereof, where the first reference switch is coupled to a middle node of a resistive divider circuit.

Aspect 23. The ADC of the preceding aspects or any combination thereof, where the set of capacitors, the comparator, the first and second reference switches, and the third switch are integrated on a single semiconductor die, and the single semiconductor die comprises an analog input node coupled to a second terminal of one capacitor of the set of the capacitors.

Aspect 24. The ADC of the preceding aspects or any combination thereof, where the set of capacitors, the comparator, the first and second reference switches, and the third switch are integrated onto multiple semiconductor dies, and one of the multiple semiconductor dies comprises an analog input node coupled to a second terminal of one capacitor of the set of the capacitors.

Aspect 25. The ADC of the preceding aspects or any combination thereof, where one or more of the set of capacitors, the comparator, the first and second reference switches, and the third switch are implemented as discrete components mounted on a circuit board, and the circuit board comprises an analog input node coupled to a second terminal of one capacitor of the set of the capacitors.

Aspect 26. The ADC of the preceding aspects or any combination thereof, where a thickness of a dielectric layer of each capacitor of the set of capacitors is less than thirty nanometers.

Aspect 27. The ADC of the preceding aspects or any combination thereof, where a thickness of a dielectric layer of each switch of the set of switches is less than thirty nanometers.

Aspect 28. The ADC of the preceding aspects or any combination thereof, where a difference between a voltage magnitude generated by a first reference voltage supply circuit coupled to the first reference voltage supply input and a voltage magnitude generated by a second reference voltage supply circuit coupled to the second reference voltage supply input is in a range between one volt and three volts.

Aspect 29. The ADC of the preceding aspects or any combination thereof, where a difference between a voltage magnitude generated by a first reference voltage supply circuit coupled to the first reference voltage supply input and a voltage magnitude generated by a middle reference voltage supply circuit coupled to the second reference voltage supply input is in a range between five hundred millivolts and two volts.

Aspect 30. A method includes activating, during a sampling phase, a first reference switch coupled between a second reference voltage supply and an input node of a comparator. The method also includes activating, during the sampling phase, a second reference switch coupled between a first reference voltage supply and a first terminal of each capacitor of a set of capacitors. In addition, the method includes deactivating, during the sampling phase, a third switch coupled between the input node of the comparator and the first terminal of each capacitor of the set of capacitors. The method further includes deactivating the first reference switch to initiate a noise-elimination phase after the sampling phase. The method includes activating the third switch after deactivating the first reference switch and during the noise-elimination phase.

Aspect 31. The method of the preceding aspect, further including activating the second reference switch during the noise-elimination phase.

Aspect 32. The method of aspect 30 or aspect 31 or any combination thereof, further including deactivating the second reference switch to initiate a conversion phase after the noise-elimination phase.

Aspect 33. The method of aspects 30-32 or any combination thereof, further including deactivating the second reference switch to initiate a conversion phase after the noise-elimination phase.

Aspect 34. The method of aspects 30-33 or any combination thereof, further including deactivating the first reference switch during the conversion phase.

Aspect 35. The method of aspects 30-34 or any combination thereof, further including activating the third switch during the conversion phase.

Aspect 36. The method of aspects 30-35 or any combination thereof, wherein a voltage magnitude of the middle reference voltage supply is between a voltage magnitude of the first reference voltage supply and a voltage magnitude of a second reference voltage supply.

Aspect 37. A device includes a computer-readable medium having executable instructions stored thereon, configured to be executable by processing circuitry for causing the processing circuitry to perform the method of aspects 30-36 or any combination thereof.

Aspect 38. A system comprising means for performing the method of aspects 30-36 or any combination thereof.

Aspect 39. A circuit includes a first reference voltage supply, a second reference voltage supply, and a third reference voltage supply, where a voltage magnitude of the third reference voltage supply is between a voltage magnitude of the first reference voltage supply and a voltage magnitude of a second reference voltage supply. The circuit also includes a comparator comprising an input node, a first reference switch coupled between the third reference voltage supply and the input node of the comparator, and a set of capacitors. Each capacitor of the set of capacitors comprises a first terminal and a second terminal, and the set of capacitors comprises a first capacitor, where a capacitance of the first capacitor is one-half of a total capacitance of the set of capacitors. In addition, the circuit includes an array of switches, where each switch of the array of switches is coupled to a second terminal of a respective capacitor of the set of capacitors. The circuit further includes an analog input node coupled to the second terminal of the first capacitor, a second reference switch coupled between the first reference voltage supply and the first terminal of each capacitor of the set of capacitors, and a third switch coupled between the input node of the comparator and the first terminal of each capacitor of the set of capacitors.

Aspect 40. The circuit of the preceding aspect, further including a control circuit configured to perform the method of aspects 30-36 or any combination thereof.

Aspect 41. The circuit of aspect 39 or aspect 40 or any combination thereof, where the first reference switch includes a first terminal coupled to the second reference voltage supply input.

Aspect 42. The circuit of aspects 39-41 or any combination thereof, where the first reference switch includes a second terminal coupled to a third switch and coupled to the input node of the comparator.

Aspect 43. The circuit of aspects 39-42 or any combination thereof, where the second reference switch includes a first terminal coupled to the first reference voltage supply input.

Aspect 44. The circuit of aspects 39-43 or any combination thereof, where the second reference switch includes a second terminal coupled to the third switch and coupled to the input node of the comparator.

Aspect 45. The circuit of aspects 39-44 or any combination thereof, where the third switch includes a first terminal coupled to the first reference switch and coupled to the input node of the comparator.

Aspect 46. The circuit of aspects 39-45 or any combination thereof, where the third switch includes a second terminal coupled to the second reference switch and coupled to the first terminal of each capacitor of the set of capacitors.

Aspect 47. The circuit of aspects 39-46 or any combination thereof, further including a resistive divider circuit coupled to the second reference voltage supply input.

Aspect 48. The circuit of aspects 39-47 or any combination thereof, where the first reference switch is coupled to a middle node of a resistive divider circuit.

Aspect 49. The circuit of aspects 39-48 or any combination thereof, where the set of capacitors, the comparator, the first and second reference switches, and the third switch are integrated on a single semiconductor die, and the single semiconductor die comprises an analog input node coupled to a second terminal of one capacitor of the set of the capacitors.

Aspect 50. The circuit of aspects 39-49 or any combination thereof, where the set of capacitors, the comparator, the first and second reference switches, and the third switch are integrated onto multiple semiconductor dies, and one of the multiple semiconductor dies comprises an analog input node coupled to a second terminal of one capacitor of the set of the capacitors.

Aspect 51. The circuit of aspects 39-50 or any combination thereof, where one or more of the set of capacitors, the comparator, the first and second reference switches, and the third switch are implemented as discrete components mounted on a circuit board, and the circuit board comprises an analog input node coupled to a second terminal of one capacitor of the set of the capacitors.

Aspect 52. The circuit of aspects 39-51 or any combination thereof, where a thickness of a dielectric layer of each capacitor of the set of capacitors is less than thirty nanometers.

Aspect 53. The circuit of aspects 39-52 or any combination thereof, where a thickness of a dielectric layer of each switch of the set of switches is less than thirty nanometers.

Aspect 54. The circuit of aspects 39-53 or any combination thereof, where the circuit is implemented as a SAR ADC.

Aspect 55. A SAR ADC includes means for coupling or decoupling a second reference voltage supply input and an input node of a comparator of the SAR ADC. In addition, the SAR ADC includes means for coupling or decoupling a first reference voltage supply input and a first terminal of each capacitor of a set of capacitors. The SAR ADC also includes means for coupling or decoupling the input node of the comparator and the first terminal of each capacitor of the set of capacitors.

Aspect 56. The SAR ADC of aspect 55, further including means for controlling the means for coupling or decoupling the second reference voltage supply input and the input node of the comparator.

Aspect 57. The SAR ADC of aspect 55 or aspect 56 or any combination thereof, further including means for controlling the means for coupling or decoupling the first reference voltage supply input and the first terminal of each capacitor of the set of capacitors.

Aspect 58. The SAR ADC of aspect 55-57 or any combination thereof, further including means for controlling the means for coupling or decoupling the input node of the comparator and the first terminal of each capacitor of the set of capacitors.

This disclosure has attributed functionality to control circuits 180 and 780. Control circuits 180 and 780 may include one or more processors. Control circuits 180 and 780 may include any combination of integrated circuitry, discrete logic circuitry, analog circuitry, such as one or more microprocessors, microcontrollers, DSPs, application specific integrated circuits (ASICs), central processing units (CPUs), graphics processing units (GPUs), FPGAs, and/or any other processing resources. In some examples, control circuits 180 and 780 may include multiple components, such as any combination of the processing resources listed above, as well as other discrete or integrated logic circuitry, and/or analog circuitry.

The techniques described in this disclosure may also be embodied or encoded in an article of manufacture including a non-transitory computer-readable storage medium. Example non-transitory computer-readable storage media may include random access memory (RAM), read-only memory (ROM), programmable ROM (PROM), erasable programmable ROM (EPROM), electronically erasable programmable ROM (EEPROM), flash memory, a solid-state drive, a hard disk, magnetic media, optical media, or any other computer readable storage devices or tangible computer readable media. The term "non-transitory" may indicate that the storage medium is not embodied in a carrier wave or a propagated signal. In certain examples, a non-transitory storage medium may store data that can, over time, change (e.g., in RAM or cache).

In this description, the term "couple" may cover connections, communications, or signal paths that enable a functional relationship consistent with this description. For example, if device A generates a signal to control device B to perform an action: (a) in a first example, device A is coupled to device B by direct connection; or (b) in a second example, device A is coupled to device B through intervening component C if intervening component C does not alter the functional relationship between device A and device B, such that device B is controlled by device A via the control signal generated by device A.

It is understood that the present disclosure provides a number of exemplary embodiments and that modification are possible to these embodiments. Such modifications are expressly within the scope of this disclosure. Furthermore, application of these teachings to other environments, applications, and/or purposes is consistent with and contemplated by the present disclosure.

What is claimed is:
1. An analog-to-digital converter (ADC) comprising:
 a first input;
 a second input;
 a comparator comprising an input node;
 a first switch coupled between the second input and the input node of the comparator;
 a set of capacitors;
 a second switch coupled between the first input and the set of capacitors; and
 a third switch coupled between the input node of the comparator and the set of capacitors.
2. The ADC of claim 1, further comprising a control circuit configured to:
 activate the first switch during a sampling phase;
 activate the second switch during the sampling phase; and
 deactivate the third switch during the sampling phase.

3. The ADC of claim 2, wherein the control circuit is configured to:
   deactivate the first switch to initiate a noise-elimination phase after the sampling phase;
   activate the second switch during the noise-elimination phase; and
   activate the third switch during the noise-elimination phase.

4. The ADC of claim 3, wherein the control circuit is configured to:
   deactivate the first switch to initiate a conversion phase after the noise-elimination phase;
   deactivate the second switch during the conversion phase; and
   activate the third switch during the conversion phase.

5. The ADC of claim 1, wherein the first switch comprises:
   a first terminal coupled to the second input; and
   a second terminal coupled to the third switch and coupled to the input node of the comparator.

6. The ADC of claim 1, wherein the second switch comprises:
   a first terminal coupled to the first input; and
   a second terminal coupled to the third switch and coupled to the input node of the comparator.

7. The ADC of claim 1, wherein each capacitor of the set of capacitors comprises a first terminal, and wherein the third switch comprises:
   a first terminal coupled to the first switch and coupled to the input node of the comparator; and
   a second terminal coupled to the second switch and coupled to the first terminal of each capacitor of the set of capacitors.

8. The ADC of claim 1, further comprising a resistive divider circuit coupled to the second input, wherein the first switch is coupled to a middle node of the resistive divider circuit.

9. The ADC of claim 1,
   wherein the set of capacitors, the comparator, the first switch, the second switch, and the third switch are integrated on a single semiconductor die, and
   wherein the single semiconductor die comprises an analog input node coupled to a second terminal of one capacitor of the set of the capacitors.

10. The ADC of claim 1, wherein a thickness of a dielectric layer of each capacitor of the set of capacitors is less than thirty nanometers.

11. The ADC of claim 1, wherein a thickness of a dielectric layer of each switch of the set of switches is less than thirty nanometers.

12. The ADC of claim 1, wherein a difference between a voltage magnitude generated by a first circuit coupled to the first input and a voltage magnitude generated by a second voltage supply circuit coupled to the second input is in a range between one volt and three volts.

13. The ADC of claim 1, wherein a difference between a voltage magnitude generated by a first voltage supply circuit coupled to the first input and a voltage magnitude generated by a middle voltage supply circuit coupled to the second input is in a range between five hundred millivolts and two volts.

14. A method comprising:
   activating, during a sampling phase, a first switch coupled between a second voltage supply and an input node of a comparator;
   activating, during the sampling phase, a second switch coupled between a first voltage supply and a set of capacitors;
   deactivating, during the sampling phase, a third switch coupled between the input node of the comparator and the set of capacitors;
   deactivating the first switch to initiate a noise-elimination phase after the sampling phase; and
   activating the third switch after deactivating the first switch and during the noise-elimination phase.

15. The method of claim 14, further comprising activating the second switch during the noise-elimination phase.

16. The method of claim 14, further comprising deactivating the second switch during a conversion phase after the noise-elimination phase.

17. The method of claim 14, further comprising deactivating the second switch to initiate a conversion phase after the noise-elimination phase.

18. The method of claim 17, further comprising:
   deactivating the first switch during the conversion phase; and
   activating the third switch during the conversion phase.

19. The method of claim 14, wherein a voltage magnitude of the second voltage supply is between a voltage magnitude of the first voltage supply and a voltage magnitude of a third voltage supply.

20. A circuit comprising:
   a first reference voltage supply;
   a second reference voltage supply;
   a third reference voltage supply, wherein a voltage magnitude of the third reference voltage supply is between a voltage magnitude of the first reference voltage supply and a voltage magnitude of the second reference voltage supply;
   a comparator comprising an input node;
   a first reference switch coupled between the third reference voltage supply and the input node of the comparator;
   a set of capacitors, wherein each capacitor of the set of capacitors comprises a first terminal and a second terminal, wherein the set of capacitors comprises a first capacitor, and wherein a capacitance of the first capacitor is one-half of a total capacitance of the set of capacitors;
   an array of switches, wherein each switch of the array of switches is coupled to a second terminal of a respective capacitor of the set of capacitors;
   an analog input node coupled to the second terminal of the first capacitor;
   a second reference switch coupled between the first reference voltage supply and the first terminal of each capacitor of the set of capacitors; and
   a third switch coupled between the input node of the comparator and the first terminal of each capacitor of the set of capacitors.

* * * * *